United States Patent [19]
Knuuti

[11] Patent Number: 5,543,721
[45] Date of Patent: Aug. 6, 1996

[54] METHOD AND DEVICE FOR EXTENDING THE DYNAMIC RANGE IN MEASUREMENTS CARRIED OUT WITH A DIRECTIONAL COUPLER

[75] Inventor: Mika Knuuti, Oulu, Finland

[73] Assignee: Nokia Telecommunications OY, Espoo, Finland

[21] Appl. No.: 170,292

[22] PCT Filed: Jun. 26, 1992

[86] PCT No.: PCT/FI92/00200

§ 371 Date: Jun. 9, 1994

§ 102(e) Date: Jun. 9, 1994

[87] PCT Pub. No.: WO93/01503

PCT Pub. Date: Jan. 21, 1993

[30] Foreign Application Priority Data

Jul. 1, 1991 [FI] Finland .................................. 913195

[51] Int. Cl.⁶ .................................................. G01R 27/04
[52] U.S. Cl. .......................................... 324/647; 455/283
[58] Field of Search ............................. 324/647, 659, 324/642; 455/283; 333/237

[56] References Cited

U.S. PATENT DOCUMENTS

| | | | |
|---|---|---|---|
| 4,149,122 | 4/1979 | Parato . | |
| 4,219,770 | 8/1980 | Weinert | 324/647 |
| 4,575,862 | 3/1986 | Tahara et al. | 375/102 |
| 4,962,359 | 10/1990 | Dunsmore . | |
| 5,159,275 | 10/1992 | Fujimura | 324/647 |
| 5,361,074 | 11/1994 | Hansen | 455/283 |

FOREIGN PATENT DOCUMENTS

| | | | |
|---|---|---|---|
| 0261828 | 3/1988 | European Pat. Off. . | |
| 0263203 | 12/1988 | Germany | 324/647 |
| 0172765 | 7/1989 | Japan | 324/659 |

*Primary Examiner*—Maura K. Regan
*Attorney, Agent, or Firm*—Cushman Darby & Cushman, L.L.P.

[57] ABSTRACT

For extending the dynamic range in measurements carried out with a directional coupler, such as antenna measurements, a signal is supplied to the object under analysis, such as an antenna, through a first port of the measuring directional coupler, part of the signal leaking as a leak signal through a second port of the measuring directional coupler directly towards a measuring device. The signal returning from the object under analysis is measured by the measuring device. To enable the measuring of signal levels lower than before, spurious signals, such as the leak signal, summing to the signal to be measured are eliminated by supplying a phased compensation signal through a second directional coupler to the measuring line.

6 Claims, 1 Drawing Sheet

METHOD AND DEVICE FOR EXTENDING THE DYNAMIC RANGE IN MEASUREMENTS CARRIED OUT WITH A DIRECTIONAL COUPLER

BACKGROUND OF THE INVENTION

The invention relates to a method for extending the dynamic range in measurements carried out with a directional coupler, such as antenna measurements. In the method, a signal is supplied to the object under analysis, such as an antenna, through a first port of the measuring directional coupler, part of the signal leaking as a leak signal through a second port of the measuring directional coupler directly towards measuring means, and the signal returning from the object under analysis is measured by the measuring means. The invention also relates to a device for carrying out the method. The device comprises (i) transmitter means for generating an electric measurement signal, (ii) a measuring directional coupler, to which the transmitter means are coupled for coupling the measurement signal to the object to be measured, and (iii) measuring means for measuring the signal returning from the object under analysis. In particular, the invention can be applied to measuring the standing-wave ratio (SWR) of an antenna in order to observe the condition of the antenna.

In measurements such as those which are mentioned above the situation is the following: the signal reflected back from the object to be measured, such as an antenna, is, when summing to the signal leaking from the directional coupler straight in the direction of the measuring means, at a random phase, e.g. depending on variations in the electric length of the antenna cable. The magnitude of the error caused by summation is thus dependent on the phase difference between the returning signal and the leaking signal, which varies, e.g., as a function of the electric length of the antenna cable. Known measuring solutions aim at the best possible directivity of the directional coupler supplying the measurement signal to the antenna, in order to render as small as possible the spurious signal leaking from the directional coupler straight in the direction of the measuring means and summing to the actual signal to be measured. The effect of other spurious signals such as those reflected from the coupling points has been diminished by calibration and by means of modification tables and correction factors. The obtained directivity of the directional coupler is, however, rarely more than 30 dB; in general the directivity is in the range of 20 . . . 30 dB, as the directional coupler is to be realised on the printed circuit board as a micro strip structure, which is production-technically advantageous, due to easy reproducibility. Owing to the limited directivity, the measuring of low signal levels, such as the signal reflected back from an antenna demonstrating a minor reflection loss, becomes difficult when the (useful) signal to be measured sums to a spurious signal leaking from the directional coupler. On the other hand, the useful signal to be measured sums also to other spurious signals passing to the measuring point, such as the signals reflected from the coupling points. In some cases, these other spurious signals may be greater in magnitude than the above-mentioned leaking signal, thus preventing the measuring of low signal levels.

SUMMARY OF THE INVENTION

The object of the present invention is therefore to obviate the drawbacks described above and to improve the dynamic range of measurements carried out with a directional coupler so that the measuring of lowlevel signals will be effected more successfully. This is achieved with the method according to the invention, which is characterised by the fact that spurious signals, such as the leak signal, summing to the signal to be measured are eliminated by supplying a phased compensation signal through a second directional coupler to the measuring line.

The basic concept of the invention is to eliminate the dominating spurious signals by supplying a compensation wave to the measuring line by means of the second directional coupler.

The solution according to the invention extends the dynamic range of the measuring by 10 . . . 25 dB, compared with conventional methods of measuring. Another advantage of the solution provided by the invention is that it enables even the use of a directional coupler with a poor directivity, since the spurious wave leaking from the directional coupler is eliminated in any case. The circuit is also inexpensive to realise, and the actual measuring is quick to carry out, as the error correction is effected in real time. The possible tuning of the compensation signal needs to be effected only in the production phase.

BRIEF DESCRIPTION OF THE DRAWINGS

In the following, the invention will be described in more detail with reference to the example depicted in the attached FIGS. 1–2 which disclose a measuring arrangement according to the invention in measuring the condition of an antenna.

DETAILED DESCRIPTION

Figure 1:
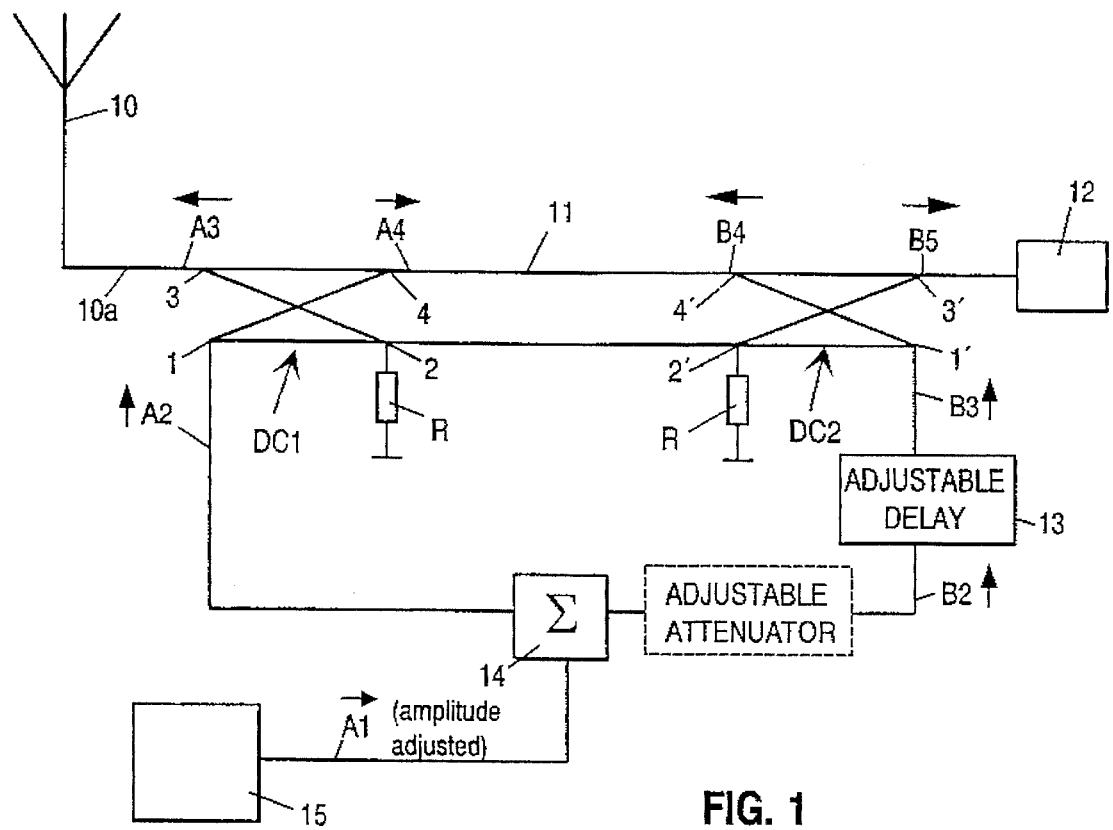
Figure 2:
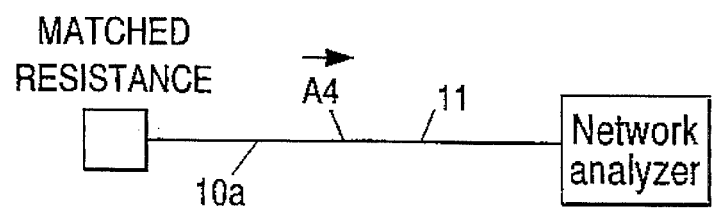

The figure discloses the measurement arrangement according to the invention when the condition of a receiving antenna 10 of the base station of a cellular network is to be checked. The condition is checked by defining the standing-wave ratio describing the electric matching of the antenna to the rest of the transmitter—and receiver system by measuring the power of the signal reflected back from the antenna with the measuring means 12 at the end of a measuring line 11 and by comparing this with the power transmitted to the antenna. Only that part of the measuring arrangement which pertains to the invention will be set out. In whole this kind of measuring arrangement is disclosed in Finnish Patent 80,817. At the front end of the measuring line 11 there is disposed a measuring directional coupler DC1 whose input port 1 is coupled to a divider 14, a travelling wave port 3 is coupled through an antenna line 10a to the antenna 10, a port 2 is terminated by resistance R and a gate 4 is coupled to the measuring line 11. Between the measuring means 12 and measuring directional coupler DC1 there is disposed a second directional coupler DC2 whose input port 1' is coupled through a delay unit 13 to the divider 14, a travelling wave port 3' is coupled to the measuring line in the direction of the measuring means 12, a port 2' is terminated by resistance R and a port 4' is coupled to the measuring line 11 in the direction of the antenna 10. Transmitter means 15 are coupled to the divider 14, supplying an electric measurement signal A1 through the divider 14 to the directional couplers. The measurement signal A1 is formed as described in the above-cited Finnish Patent 80,817 from the transmitter signal by mixing it with a transfer oscillator to the desired measuring frequency.

In addition to the measurement signal A1, in the figure signals from and to the directional coupler DC1 are marked with reference signs An (n=2 . . . 4) and signals from and to the directional coupler DC2 with reference signs Bn (n=2 . . . 5). Next to the reference signs tiny arrows are drawn indicating the travelling direction of the signal in question.

The measurement signal A2 which is supplied to the antenna 10 through the divider 14 and the measuring directional coupler DC1 leaks in the measuring directional coupler DC1 straight in the direction of the measuring means 12. This leak signal A4 sums to the signal returning from the antenna at a random phase causing an error whose magnitude is dependent on the reciprocal phase of the leak signal and the signal returning from the antenna. In addition to the leak signal, error is caused, e.g., by the summing of reflections caused by cables and connectors in the antenna line to the signal returning from the antenna.

The correction of the error (improving the dynamics) can be divided into two situations: (1) a situation in which the leak signal A4 of the measuring directional coupler DC1 is stronger than the other spurious waves and (2) a situation in which the other spurious waves are stronger than the leak signal A4.

In situation (1), which is more general, the leak wave A4 is eliminated by supplying using a second directional coupler D2 in the direction of the measuring means 12, a compensation signal B5 which has an amplitude which is equal to that of the leak signal A4, but in relation thereto delayed in its phase by half a wave length ($\lambda/2$) or its odd multiplicity. The compensation signal is formed of the measurement signal A1 by branching the measurement signal by means of the divider 14 through a delay unit 13 to the second directional coupler DC2. In order for the amplitude of the compensation signal to be equal to that of the leak wave, the coupling of the second directional coupler DC2 is equal in magnitude to the sum of the coupling and the directivity of the measuring directional coupler DC1 (no losses in the measuring line). If, thus, for instance, the directivity of the measuring directional coupler DC1 ($D_1=10 \log A3/A4$) is 20 dB and the coupling ($C_1=10 \log A2/A3$) 20 dB as well, the coupling of the second directional coupler DC2 ($C_2=10 \log B3/B5$) will be 40 dB. In order for the phase of the compensation signal to be transferred by half a wave length (or its odd multiplicity) with regard to the leak wave, a delay d1 of the delay unit 13 would be of such magnitude that a delay d2 of the signal between the directional couplers DC1 and DC2 deducted from the delay d1 has a magnitude of half a wave length or its odd multiplicity ($d1-d2=n\lambda/2$, $n=1, 3, 5 \ldots$). As the compensation signal B5 eliminates the leak wave A4, the signal to be measured is no longer dependent on the electric length of the antenna line (antenna cable); in other words, the summing of the signal returning from the antenna at a random phase to the leak signal no longer causes measurement error. Measurement error is, however, still caused to some extent by other factors such as cables and connectors. The dynamic range of the measurement can nevertheless be extended by 10 . . . 25 dB compared with conventional methods.

In situation (2) the compensation signal must be tuned separately to equal in amplitude the spurious signal in the measuring line and to be in its phase opposite to this spurious signal. The tuning may be accomplished e.g. by terminating the antenna line with a matched resistance (test load) and carrying out in time domain in a manner known per sea measurement (time domain analysis) which gives the amplitude and phase of the reflected spurious signal, in other words, the location of the point causing reflection and the magnitude of the reflection. Before the measurement, already at the planning stage, all points (reflection points) having an effect on the standing-wave ratio in the antenna line should be taken into account by adjusting those points at the measuring frequency in question at intervals of half a wave length or its multiplicity. This enables elimination of all factors causing spurious signals by means of one additional directional coupler DC2.

Although the invention has been described above with reference to the example depicted in the attached drawing, it is clear that the invention is not restricted thereto but can be modified in many ways within the scope of the inventive concept set forth above and in the attached claims. In principle in place of the directional couplers there could be other directional means, e.g. a capacitively coupled hybrid. For this reason the used term 'directional coupler' should be understood in a larger sense. Neither is measuring limited solely to antenna measurements, but the principle according to the invention can also be used in other measurements carried out with directional couplers. It is also possible to change the mutual order of the directional couplers.

I claim:

1. A method for extending the dynamic range in measurements carried out with a directional coupler, comprising:

(a) supplying a signal in a first direction towards an object which is under analysis, through a first port of a measuring directional coupler, whereupon part of said signal leaks as a leak signal through a second port of said measuring coupler, in a second direction to a measuring line, towards a measuring device;

(b) measuring a returning signal returning from said object, using said measuring device; and (c) while conducting steps (a) and (b), eliminating a spurious signal comparable to said leak signal propagating in said second direction towards said measuring device, by supplying through a second directional coupler, to said measuring line, a phased compensation signal propagating in said second direction towards said measuring device with substantially the same amplitude as, but substantially opposite in phase to, said spurious signal.

2. The method of claim 1, wherein step (c) further includes:

delaying said compensation signal, so that the phase difference between said compensation signal and said spurious signal has a magnitude of half a wavelength, or an odd integer multiple of a wavelength; and adjusting the amplitude of said compensation signal to be equal to the amplitude of the leak signal, by adjusting coupling of said second directional coupler to be equal in magnitude to the sum of the coupling and directivity of said measuring directional coupler.

3. The method of claim 1, wherein step (c) further includes:

determining said spurious signal occurring in said measuring line, by making a separate measurement thereof; and turning said compensation signal based on said measurement.

4. The method of claim 1, wherein:

said object is an antenna.

5. Apparatus for extending dynamic range in measurements carried out with a directional coupler, comprising:

a transmitter for generating an electric measurement signal;

a measuring directional coupler to which said transmitter is coupled for supplying the measurement signal towards an object to be measured;

measuring equipment coupled to a measuring line for measuring a returning signal returning from said object;

said measuring directional port having a first port for travelling wave, said first port being coupled to a first direction towards said object for supplying a measurement signal to said object;

said measuring directional port having a second port, said second port being coupled to the measuring line to a second direction towards the measuring equipment;

part of the measurement signal leaking in use, as a leak signal through said second port to said measuring line and propagating towards said measuring equipment;

a second directional coupler, said second directional coupler being coupled to the measuring line and having a third port for a travelling wave, said third port being coupled to said measuring line to a third direction towards the measuring equipment for supplying a phased compensation signal towards said measuring equipment;

said compensation signal being of substantially a same amplitude as, but of substantially opposite phase to, a given spurious signal, summing to said returning signal; and said transmitter being operatively coupled to said second directional coupler through a delay unit for adjusting the phase of the compensation signal.

6. The apparatus of claim 5, wherein:

coupling of said second directional coupler is equal in magnitude to the sum of directivity and coupling of said measuring directional coupler.

* * * * *